(12) United States Patent
Hayakawa et al.

(10) Patent No.: US 12,396,313 B2
(45) Date of Patent: Aug. 19, 2025

(54) SOLAR CELL

(71) Applicant: SEKISUI CHEMICAL CO., LTD., Osaka (JP)

(72) Inventors: Akinobu Hayakawa, Osaka (JP); Takurou Okumura, Ibaraki (JP); Takeshi Fukuda, Tokyo (JP)

(73) Assignee: SEKISUI CHEMICAL CO., LTD., Osaka (JP)

(*) Notice: Subject to any disclaimer, the term of this patent is extended or adjusted under 35 U.S.C. 154(b) by 361 days.

(21) Appl. No.: 17/435,481

(22) PCT Filed: Mar. 16, 2020

(86) PCT No.: PCT/JP2020/011392
§ 371 (c)(1),
(2) Date: Sep. 1, 2021

(87) PCT Pub. No.: WO2020/189615
PCT Pub. Date: Sep. 24, 2020

(65) Prior Publication Data
US 2022/0140269 A1    May 5, 2022

(30) Foreign Application Priority Data
Mar. 19, 2019    (JP) .................... 2019-051297

(51) Int. Cl.
*H10K 30/81*    (2023.01)
*H10K 30/00*    (2023.01)
(Continued)

(52) U.S. Cl.
CPC .......... *H10K 30/81* (2023.02); *H10K 30/451* (2023.02); *H10K 30/82* (2023.02); *H10K 30/87* (2023.02); *H10K 85/50* (2023.02); *H10K 30/85* (2023.02)

(58) Field of Classification Search
None
See application file for complete search history.

(56) References Cited

U.S. PATENT DOCUMENTS

2015/0279573 A1* 10/2015 Horiuchi .............. H01G 9/2059
                                                                136/263
2016/0329444 A1    11/2016 Koike et al.
(Continued)

FOREIGN PATENT DOCUMENTS

CN    104183697    12/2014
CN    105830227    8/2016
(Continued)

OTHER PUBLICATIONS

Reese, M. O. et al., "Photoinduced Degradation of Polymer and Polymer-Fullerene Active Layers: Experiment and Theory", Advanced Functional Materials, 2010, vol. 20, pp. 3476-3483.
(Continued)

*Primary Examiner* — Bo B Jang
(74) *Attorney, Agent, or Firm* — Wenderoth, Lind & Ponack, L.L.P.

(57) ABSTRACT

The present invention aims to provide a solar cell having high photoelectric conversion efficiency that is less likely to decrease even under prolonged application of a voltage. Provided is a solar cell including a cathode, a photoelectric conversion layer, a diffusion prevention layer, and an anode in the stated order, the cathode being a transparent electrode, the anode containing at least one selected from the group consisting of aluminum, copper, antimony, and molybdenum, the photoelectric conversion layer containing an organic-inorganic perovskite compound represented by the formula AMX wherein A represents an organic base compound and/or an alkali metal, M represents a lead or tin atom, and X represents a halogen atom, the diffusion prevention layer being a diffusion prevention layer that contains
(Continued)

molybdenum, tungsten, tantalum, niobium, zirconium, hafnium, or an alloy of two or more thereof and has a thickness of 5 to 30 nm, a diffusion prevention layer that contains an oxide containing titanium, gallium, zinc, tin, indium, antimony, molybdenum, tungsten, vanadium, chromium, nickel, or lead, a diffusion prevention layer that contains a nitride containing titanium, vanadium, chromium, niobium, tantalum, molybdenum, zirconium, or hafnium and has a thickness of 5 to 50 nm, or a diffusion prevention layer that contains graphite and has a thickness of 2 nm to 50 nm.

1 Claim, 1 Drawing Sheet

(51) Int. Cl.
  *H10K 30/82* (2023.01)
  *H10K 30/85* (2023.01)
  *H10K 30/87* (2023.01)
  *H10K 85/50* (2023.01)

(56) References Cited

U.S. PATENT DOCUMENTS

| | | |
|---|---|---|
| 2017/0186818 A1 | 6/2017 | Yen et al. |
| 2019/0051464 A1* | 2/2019 | Gotanda ................ H01G 9/204 |
| 2019/0181290 A1* | 6/2019 | Hsu ....................... H01L 31/043 |
| 2019/0198256 A1 | 6/2019 | Hayakawa et al. |

FOREIGN PATENT DOCUMENTS

| | | |
|---|---|---|
| CN | 107068867 | 8/2017 |
| CN | 109216554 | 1/2019 |
| EP | 2 924 755 | 9/2015 |
| JP | 2006-344794 | 12/2006 |
| JP | 4120362 | 5/2008 |
| JP | 2019-36598 | 3/2019 |
| KR | 2016-0139986 | 12/2016 |
| WO | 2011/158874 | 12/2011 |
| WO | 2018/056295 | 3/2018 |
| WO | 2019/197893 | 10/2019 |

OTHER PUBLICATIONS

Lee, M. M. et al., "Efficient Hybrid Solar Cells Based on Meso-Superstructured Organometal Halide Perovskites", Science, Nov. 2, 2012, vol. 338, pp. 643-647.

International Search Report issued Jun. 2, 2020 in corresponding International (PCT) Patent Application No. PCT/JP2020/011392.

Yixin Zhao et al., "Effective hole extraction using $MoO_x$-Al contact in perovskite $CH_3NH_3PbI_3$ solar cells", Applied Physics Letters, 2014, 104, pp. 213906-1-213906-4.

Jost, Marko, et al., "21.6%—Efficient Monolithic Perovskite/$Cu(In,Ga)Se_2$ Tandem Solar Cells with Thin Conformal Hole Transport Layers for Integration on Rough Bottom Cell Surfaces," ACS Energy Letters, vol. 4, Jan. 24, 2019, pp. 583-590.

* cited by examiner

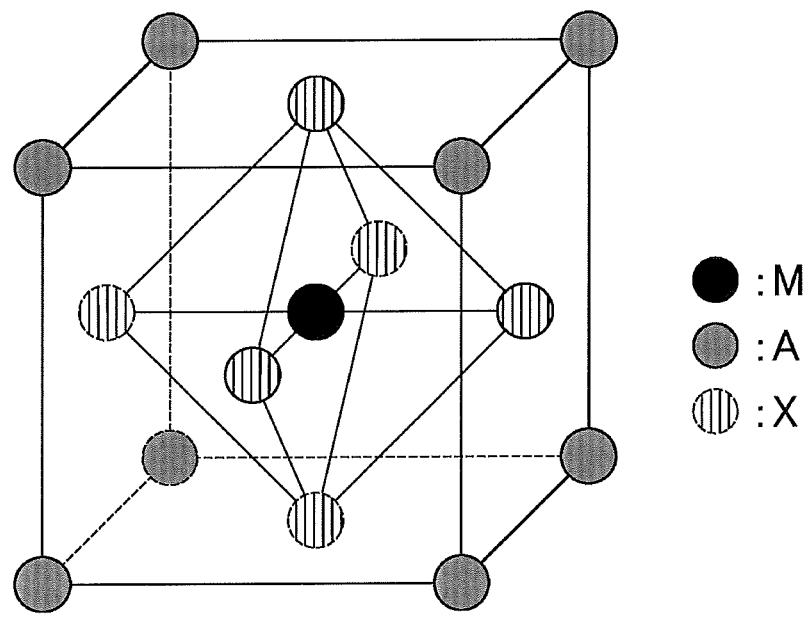

SOLAR CELL

TECHNICAL FIELD

The present invention relates to a solar cell having high photoelectric conversion efficiency that is less likely to decrease even under prolonged application of a voltage.

BACKGROUND ART

Solar cells including a laminate (photoelectric conversion layer) having an N-type semiconductor layer and a P-type semiconductor layer disposed between opposing electrodes have been conventionally developed. Such solar cells generate photocarriers (electron-hole pairs) by photoexcitation so that electrons and holes move through the N-type semiconductor and the P-type semiconductor, respectively, to create an electric field.

Most solar cells currently in practical use are inorganic solar cells which are produced using inorganic semiconductors made of silicon or the like. The inorganic solar cells, however, are utilized only in a limited range because their production is costly and upsizing thereof is difficult. Therefore, organic solar cells produced using organic semiconductors instead of inorganic semiconductors (see Patent Literatures 1 and 2, for example) and organic-inorganic solar cells produced using organic semiconductors and inorganic semiconductors in combination have received attention.

Fullerene is used in most organic solar cells and organic-inorganic solar cells. Fullerene is known to function mainly as an N-type semiconductor. For example, Patent Literature 3 discloses a semiconductor heterojunction film formed using an organic compound serving as a P-type semiconductor, and a fullerene. Fullerene, however, is known to be responsible for degradation of organic solar cells or organic-inorganic solar cells produced using the fullerene (see Non-Patent Literature 1, for example). Thus, a material that can replace fullerene is desired.

Recently, photoelectric conversion materials having a perovskite structure containing lead, tin, or the like as a central metal, called organic-inorganic hybrid semiconductors, have been found and proved to have high photoelectric conversion efficiency (see Non-Patent Literature 2, for example).

Perovskite solar cells containing such photoelectric conversion materials having a perovskite structure have high photoelectric conversion efficiency immediately after production. However, when a voltage is applied to such solar cells for a prolonged period of time, the solar cells may suffer a decrease in photoelectric conversion efficiency due to diffusion of the material of the anode into the photoelectric conversion layer containing the organic-inorganic perovskite compound.

CITATION LIST

Patent Literature

Patent Literature 1: JP 2006-344794 A
Patent Literature 2: JP 4120362 B
Patent Literature 3: JP 2006-344794 A

Non-Patent Literature

Non-Patent Literature 1: Reese et al., Adv. Funct. Mater., 20, 3476-3483 (2010)

Non-Patent Literature 2: M. M. Lee et al., Science, 338, 643-647 (2012)

SUMMARY OF INVENTION

Technical Problem

To counter the situation, the present inventors have disclosed a solar cell in Japanese Patent Application No. 2016-184375. The solar cell includes a diffusion prevention layer containing a specific metal between a photoelectric conversion layer containing an organic-inorganic perovskite compound and a specific anode. In the solar cell of Japanese Patent Application No. 2016-184375, the photoelectric conversion layer containing the specific metal can prevent diffusion of the anode, enabling the solar cell to maintain high photoelectric conversion efficiency even under prolonged application of a voltage.

In recent years, however, the competition to increase the photoelectric conversion efficiency in the solar cell field has intensified, creating a demand for a solar cell having higher photoelectric conversion efficiency.

The present invention aims to provide a solar cell having high photoelectric conversion efficiency that is less likely to decrease even under prolonged application of a voltage.

Solution to Problem

The present invention relates to a solar cell including a cathode, a photoelectric conversion layer, a diffusion prevention layer, and an anode in the stated order, the cathode being a transparent electrode, the anode containing at least one selected from the group consisting of aluminum, copper, antimony, and molybdenum, the photoelectric conversion layer containing an organic-inorganic perovskite compound represented by the formula AMX wherein A represents an organic base compound and/or an alkali metal, M represents a lead or tin atom, and X represents a halogen atom, the diffusion prevention layer being a diffusion prevention layer that contains molybdenum, tungsten, tantalum, niobium, zirconium, hafnium, or an alloy containing one or more thereof and has a thickness of 5 to 30 nm, a diffusion prevention layer that contains an oxide containing titanium, gallium, zinc, tin, indium, antimony, molybdenum, tungsten, vanadium, chromium, nickel, or lead, a diffusion prevention layer that contains a nitride containing titanium, vanadium, chromium, niobium, tantalum, molybdenum, zirconium, or hafnium and has a thickness of 5 to 50 nm, or a diffusion prevention layer that contains graphite and has a thickness of 2 nm to 50 nm.

The present invention is described in detail below.

To further improve the photoelectric conversion efficiency of a perovskite solar cell including a diffusion prevention layer, the present inventors studied the use, as the anode, of a material that reflect light transmitted through the photoelectric conversion layer. The photoelectric conversion layer containing an organic-inorganic perovskite compound absorbs light particularly at a wavelength of 400 to 600 nm, and transmits most of the light at wavelengths out of this range. Therefore, an anode that reflects light transmitted through the photoelectric conversion layer, particularly light at 600 nm to 800 nm, and allows the light to pass through the photoelectric conversion layer again is expected to improve the photoelectric conversion efficiency. However, the use of a light-reflecting anode in a perovskite solar cell including a diffusion prevention layer has not improved the photoelectric conversion efficiency as much as expected.

As a result of studies, the present inventors have found out that the reason why the improvement is less than expected is that the diffusion prevention layer absorbs light; absorption of light by the diffusion prevention layer decreases the amount of light to be reflected by the anode and return to the photoelectric conversion layer, thus reducing the improvement in the photoelectric conversion efficiency. Gold has been used as the material to reflect light at 600 nm to 800 nm. Gold, however, easily diffuses into the photoelectric conversion layer. Preventing diffusion of gold thus requires a thicker diffusion prevention layer, which absorbs more light. Based on these findings, the present inventors made further studies, and have found out that use of specific metals in the anode and the diffusion prevention layer can prevent diffusion of the anode and reduce light absorption in the diffusion prevention layer, allowing further improvement in the photoelectric conversion efficiency. The inventors thus have completed the present invention.

The solar cell of the present invention includes a cathode, a photoelectric conversion layer, a diffusion prevention layer, and an anode in the stated order.

The term "layer" as used herein means not only a layer having a clear boundary, but also a layer having a concentration gradient in which contained elements are gradually changed. The elemental analysis of the layer can be conducted, for example, by FE-TEM/EDS analysis of a cross section of the solar cell to confirm the element distribution of a particular element. The term "layer" as used herein means not only a flat thin-film layer, but also a layer capable of forming an intricate structure together with other layer(s).

The cathode is a transparent electrode.

Examples of cathode materials include fluorine-doped tin oxide (FTO), tin-doped indium oxide (ITO), sodium, sodium-potassium alloys, lithium, magnesium, aluminum, magnesium-silver mixtures, magnesium-indium mixtures, aluminum-lithium alloys, $Al/Al_2O_3$ mixtures, and Al/LiF mixtures. These materials may be used alone or in combination of two or more.

The cathode may have any thickness. The lower limit of the thickness is preferably 10 nm and the upper limit thereof is preferably 1,000 nm. The cathode having a thickness of 10 nm or more can function as an electrode while having low resistance. The cathode having a thickness of 1,000 nm or less can have more improved light transmittance. The lower limit of the thickness of the cathode is more preferably 50 nm and the upper limit thereof is more preferably 500 nm.

The photoelectric conversion layer contains an organic-inorganic perovskite compound represented by the formula AMX wherein A represents an organic base compound and/or an alkali metal, M represents a lead or tin atom, and X represents a halogen atom. A solar cell including the photoelectric conversion layer that contains the organic-inorganic perovskite compound is also referred to as an organic-inorganic hybrid solar cell.

The use of the organic-inorganic perovskite compound in the photoelectric conversion layer can improve the photoelectric conversion efficiency of the solar cell.

A in the formula represents an organic base compound and/or an alkali metal.

Specific examples of the organic base compound include methylamine, ethylamine, propylamine, butylamine, pentylamine, hexylamine, dimethylamine, diethylamine, dipropylamine, dibutylamine, dipentylamine, dihexylamine, trimethylamine, triethylamine, tripropylamine, tributylamine, tripentylamine, trihexylamine, ethylmethylamine, methylpropylamine, butylmethylamine, methylpentylamine, hexylmethylamine, ethylpropylamine, ethylbutylamine, formamidine, acetoamidine, guanidine, imidazole, azole, pyrrole, aziridine, azirine, azetidine, azete, azole, imidazoline, carbazole and their ions (e.g., methylammonium ($CH_3NH_3$)), and phenethylammonium. Among them, preferred are methylamine, ethylamine, propylamine, butylamine, pentylamine, hexylamine, formamidine, acetoamidine and their ions, and phenethylammonium, and more preferred are methylamine, ethylamine, propylamine, formamidine and their ions.

Examples of the alkali metal include lithium, sodium, potassium, rubidium, and cesium.

M in the formula represents a metal atom, and is lead or tin. These metal atoms may be used alone or in combination of two or more thereof.

X in the formula represents a halogen atom. Examples thereof include chlorine, bromine, iodine, sulfur, and selenium. These halogen atoms may be used alone or in combination of two or more. The organic-inorganic perovskite compound containing halogen in the structure is soluble in an organic solvent and is usable in an inexpensive printing method or the like. In particular, X is preferably iodine because it allows the organic-inorganic perovskite compound to have a narrower energy band gap.

The organic-inorganic perovskite compound preferably has a cubic crystal structure where the metal atom M is placed at the body center, the organic base compound or alkali metal A is placed at each vertex, and the halogen atom X is placed at each face center.

FIG. 1 is a schematic view illustrating an exemplary crystal structure of the organic-inorganic perovskite compound having a cubic crystal structure where the metal atom M is placed at the body center, the organic base compound or alkali metal A is placed at each vertex, and the halogen atom X is placed at each face center. Although the details are not clear, it is presumed that this structure allows the octahedron in the crystal lattice to change its orientation easily, which enhances the mobility of electrons in the organic-inorganic perovskite compound, improving the photoelectric conversion efficiency of the solar cell.

The organic-inorganic perovskite compound is preferably a crystalline semiconductor. The crystalline semiconductor means a semiconductor whose scattering peak can be detected by the measurement of X-ray scattering intensity distribution. When the organic-inorganic perovskite compound is a crystalline semiconductor, the mobility of electrons in the organic-inorganic perovskite compound is enhanced, improving the photoelectric conversion efficiency of the solar cell.

The degree of crystallinity can also be evaluated as an index of crystallization. The degree of crystallinity can be determined by separating a crystalline substance-derived scattering peak from an amorphous portion-derived halo, which are detected by X-ray scattering intensity distribution measurement, by a fitting technique, determining the respective intensity integrals, and calculating the proportion of the crystalline portion to the whole.

The lower limit of the degree of crystallinity of the organic-inorganic perovskite compound is preferably 30%. When the degree of crystallinity is 30% or higher, the mobility of electrons in the organic-inorganic perovskite compound is enhanced, improving the photoelectric conversion efficiency of the solar cell. The lower limit of the degree of crystallinity is more preferably 50%, still more preferably 70%.

Examples of the method for increasing the degree of crystallinity of the organic-inorganic perovskite compound include thermal annealing, irradiation with strong-intensity light, such as laser, and plasma irradiation.

The photoelectric conversion layer may further contain an organic semiconductor or an inorganic semiconductor, in addition to the organic-inorganic perovskite compound, as long as the effects of the present invention are not impaired. The organic semiconductor or inorganic semiconductor herein may serve as a hole transport layer or an electron transport layer, respectively.

Examples of the organic semiconductor include compounds having a thiophene skeleton, such as poly(3-alkyl-thiophene). The examples also include conductive polymers having a poly-p-phenylenevinylene skeleton, a polyvinylcarbazole skeleton, a polyaniline skeleton, a polyacetylene skeleton, or the like. The examples further include compounds having a phthalocyanine skeleton, a naphthalocyanine skeleton, a pentacene skeleton, a porphyrin skeleton such as a benzoporphyrin skeleton, a spirobifluorene skeleton or the like.

Examples of the inorganic semiconductor include titanium oxide, zinc oxide, indium oxide, tin oxide, gallium oxide, tin sulfide, indium sulfide, zinc sulfide, CuSCN, $Cu_2O$, CuI, $MoO_3$, $V_2O_5$, $WO_3$, $MoS_2$, $MoSe_2$, and $Cu_2S$.

The photoelectric conversion layer containing the organic-inorganic perovskite compound and the organic semiconductor or inorganic semiconductor may be a laminate in which a thin-film organic semiconductor or inorganic semiconductor part and a thin-film organic-inorganic perovskite compound part are stacked, or may be a composite film in which an organic semiconductor or inorganic semiconductor part and an organic-inorganic perovskite compound part are combined. The laminate is preferred from the viewpoint of a simple production process. The composite film is preferred from the viewpoint of improvement in charge separation efficiency in the organic semiconductor or the inorganic semiconductor.

The lower limit of the thickness of the thin-film organic-inorganic perovskite compound part is preferably 5 nm and the upper limit thereof is preferably 5,000 nm. When the thickness is 5 nm or more, the thin-film organic-inorganic perovskite compound part can sufficiently absorb light, enhancing the photoelectric conversion efficiency. When the thickness is 5,000 nm or less, formation of a region which fails to achieve charge separation can be reduced, improving the photoelectric conversion efficiency. The lower limit of the thickness is more preferably 10 nm and the upper limit thereof is more preferably 1,000 nm. The lower limit of the thickness is still more preferably 20 nm and the upper limit thereof is still more preferably 500 nm.

When the photoelectric conversion layer is a composite film in which an organic semiconductor or inorganic semiconductor part and an organic-inorganic perovskite compound part are combined, the lower limit of the thickness of the composite film is preferably 30 nm and the upper limit thereof is preferably 3,000 nm. When the thickness is 30 nm or more, the composite film can sufficiently absorb light, enhancing the photoelectric conversion efficiency. When the thickness is 3,000 nm or less, charges easily reach the electrodes, enhancing the photoelectric conversion efficiency. The lower limit of the thickness is more preferably 40 nm and the upper limit thereof is more preferably 2,000 nm. The lower limit is still more preferably 50 nm and the upper limit is still more preferably 1,000 nm.

The photoelectric conversion layer may be formed by any method. Examples of the method include a vacuum evaporation method, a sputtering method, a chemical vapor deposition method (CVD), an electrochemical sedimentation method, and a printing method. In particular, the use of a printing method enables simple formation of a large-area solar cell that can exhibit high photoelectric conversion efficiency. Examples of the printing method include a spin coating method and a casting method. Examples of the method using the printing method include a roll-to-roll method.

The solar cell of the present invention may include an electron transport layer between the cathode and the photoelectric conversion layer.

The electron transport layer may be formed from any material. Examples of the material include N-type conductive polymers, N-type low-molecular organic semiconductors, N-type metal oxides, N-type metal sulfides, alkali metal halides, alkali metals, and surfactants. Specific examples thereof include cyano group-containing polyphenylene vinylene, boron-containing polymers, bathocuproine, bathophenanthroline, (hydroxyquinolinato)aluminum, oxadiazole compounds, and benzoimidazole compounds. The examples further include naphthalenetetracarboxylic acid compounds, perylene derivatives, phosphine oxide compounds, phosphine sulfide compounds, fluoro group-containing phthalocyanine, titanium oxide, zinc oxide, indium oxide, tin oxide, gallium oxide, tin sulfide, indium sulfide, and zinc sulfide.

The electron transport layer may consist only of a thin-film electron transport layer. Preferably, the electron transport layer includes a porous electron transport layer. In particular, when the photoelectric conversion layer is a composite film in which an organic semiconductor or inorganic semiconductor part and an organic-inorganic perovskite compound part are combined, the composite film is preferably formed on a porous electron transport layer. This is because a more complicated composite film (more intricate structure) can be obtained, enhancing the photoelectric conversion efficiency.

The lower limit of the thickness of the electron transport layer is preferably 1 nm and the upper limit thereof is preferably 2,000 nm. When the thickness is 1 nm or more, holes can be sufficiently blocked. When the thickness is 2,000 nm or less, the layer is less likely to serve as resistance to electron transport, enhancing the photoelectric conversion efficiency. The lower limit of the thickness of the electron transport layer is more preferably 3 nm and the upper limit thereof is more preferably 1,000 nm. The lower limit is still more preferably 5 nm and the upper limit is still more preferably 500 nm.

The anode contains at least one selected from the group consisting of aluminum, copper, antimony, and molybdenum.

Aluminum, copper, antimony, and molybdenum are less likely to diffuse than gold, the conventional light-reflecting anode, but can sufficiently reflect light at 600 nm to 800 nm that is used by the organic-inorganic perovskite compound for power generation. Thus, an anode containing at least one of aluminum, copper, antimony or molybdenum can reflect light transmitted through the photoelectric conversion layer while reducing diffusion. Moreover, combined use of the anode containing at least one of aluminum, copper, antimony or molybdenum, the photoelectric conversion layer, and the later-described diffusion prevention layer can reduce the amount of light absorbed in the diffusion prevention layer, allowing further improvement of the photoelectric conversion efficiency.

The anode may have any thickness. The lower limit of the thickness is preferably 10 nm and the upper limit thereof is preferably 1,000 nm. The anode having a thickness of 10 nm or more can function as an electrode while having low resistance. The anode having a thickness of 1,000 nm or less can have more improved light transmittance. The lower limit of the thickness of the anode is more preferably 50 nm and the upper limit thereof is more preferably 500 nm.

The diffusion prevention layer functions to prevent the material(s) of the anode from diffusing into the photoelectric conversion layer containing an organic-inorganic perovskite compound, thus allowing the solar cell to maintain high photoelectric conversion efficiency even under prolonged application of a voltage. When the diffusion prevention layer used is the diffusion prevention layer described later, the diffusion prevention layer is less likely to absorb light transmitted through the photoelectric conversion layer, thus allowing more light to be sent back to the photoelectric conversion layer. The degree of light absorption in the diffusion prevention layer is greatly affected by the materials of the photoelectric conversion layer and anode adjacent to the diffusion prevention layer. Thus, to effectively reduce light absorption in the diffusion prevention layer, the material of the diffusion prevention layer needs to be selected in consideration of the materials of the anode and the photoelectric conversion layer.

The diffusion prevention layer preferably has a transmittance of light at a wavelength of 600 to 800 nm of 50% or higher. When the light transmittance is within the above range, light absorption in the diffusion prevention layer can be reduced. In other words, more light can be reflected by the anode and pass through the photoelectric conversion layer again, so that the photoelectric conversion efficiency of the resulting solar cell can be more improved. As noted above, the amount of light absorbed in the diffusion prevention layer is greatly affected by the materials of the anode and photoelectric conversion layer adjacent to the diffusion prevention layer, particularly the refractive index of these materials. It is thus impossible to measure the light transmittance of the diffusion prevention layer alone. The light transmittance can be obtained by simulation using Fresnel equations.

The diffusion prevention layer preferably contains a metal or metal compound having a bond energy of 300 kJ/mol or more.

Use of a metal or metal compound having the above bond energy as the material of the diffusion prevention layer can reduce diffusion of the metal constituting the anode, leading to more improved photoelectric conversion efficiency of the resulting solar cell. The bond energy is more preferably 350 kJ/mol or more. The bond energy can be obtained by determining the difference in enthalpy of formation between the metal or metal compound in the bound state and the metal or metal compound alone.

The diffusion prevention layer is preferably a dense film. More specifically, the diffusion prevention layer is preferably a dense film that is dense to the extent that the upper and lower layers having the diffusion prevention layer therebetween are not in contact with each other at any part in transmission electron microscopic pictures taken at arbitrary ten sites in a cross section resulting from cutting of the solar cell with a focused ion beam (FIB). In other words, the diffusion prevention layer is preferably dense to the extent that the upper and lower layers having the diffusion prevention layer therebetween are separated from each other by the diffusion prevention layer. When the diffusion prevention layer is a dense film, the photoelectric conversion efficiency of the solar cell is even less likely to decrease, so that the photoelectric conversion efficiency is even less likely to decrease under prolonged application of a voltage to the solar cell.

The transmission electron microscope may be, for example, JEM-2010-FEF (produced by JEOL Ltd.).

The diffusion prevention layer is a diffusion prevention layer that contains molybdenum, tungsten, tantalum, niobium, zirconium, hafnium, or an alloy containing one or more thereof and has a thickness of 5 to 30 nm, a diffusion prevention layer that contains an oxide containing titanium, gallium, zinc, tin, indium, antimony, molybdenum, tungsten, vanadium, chromium, nickel, or lead, a diffusion prevention layer that contains a nitride containing titanium, vanadium, chromium, niobium, tantalum, molybdenum, zirconium, or hafnium and has a thickness of 5 to 50 nm, or a diffusion prevention layer that contains graphite and has a thickness of 2 nm to 50 nm.

The diffusion prevention layer constituted by the metal, the metal compound, or graphite and having a thickness within the above range can reduce diffusion of the metal constituting the anode into the photoelectric conversion layer. Moreover, combined use of the diffusion prevention layer with the anode and the photoelectric conversion layer can reduce absorption of light transmitted through the photoelectric conversion layer, allowing more light to reach the anode and more reflected light from the anode to reach the photoelectric conversion layer. This can increase the amount of power generated in the photoelectric conversion layer, improving the photoelectric conversion efficiency. Hereinafter, the diffusion prevention layer that contains molybdenum, tungsten, tantalum, niobium, zirconium, hafnium, or an alloy containing one or more thereof and has a thickness of 5 to 30 nm is referred to as a diffusion prevention layer 1. The diffusion prevention layer that contains an oxide containing titanium, gallium, zinc, tin, indium, antimony, molybdenum, tungsten, vanadium, chromium, nickel, or lead is referred to as a diffusion prevention layer 2. The diffusion prevention layer that contains a nitride containing titanium, vanadium, chromium, niobium, tantalum, molybdenum, zirconium, or hafnium and has a thickness of 5 to 50 nm is referred to as a diffusion prevention layer 3. The diffusion prevention layer that contains graphite and has a thickness of 2 nm to 50 nm is referred to as a diffusion prevention layer 4.

The material of the diffusion prevention layer 1 is not limited as long as the material is constituted by the metal or alloy. Molybdenum and tungsten are preferred because they can further reduce the light absorption in the diffusion prevention layer. In the case where the anode is molybdenum, the material of the diffusion prevention layer 1 is preferably tungsten, tantalum, niobium, zirconium, hafnium, or an alloy containing one or more of these metals. The diffusion prevention layer 1 preferably has a thickness of 10 nm or more, more preferably 15 nm or more, and preferably 25 nm or less, more preferably 20 nm or less, so as to more reliably reduce diffusion of the metal constituting the anode and further reduce light absorption in the diffusion prevention layer.

The material of the diffusion prevention layer 2 is not limited as long as the material contains an oxide containing the metal. Examples of the material include niobium-doped titanium oxide, tin-doped indium oxide (ITO), gallium-doped zinc oxide (GZO), nickel oxide, molybdenum oxide, tungsten oxide, antimony-doped tin oxide (ATO), vanadium oxide, chromium oxide, and lead oxide. Preferred among them are tin-doped indium oxide (ITO), gallium-doped zinc oxide (GZO), nickel oxide, molybdenum oxide, tungsten oxide, and antimony-doped tin oxide (ATO) because these can further reduce light absorption in the diffusion prevention layer. The material of the diffusion prevention layer 2 is preferably colorless so that light absorption in the diffusion prevention layer can be further reduced. In the case of using a colored oxide containing the metal, the diffusion prevention layer 2 is preferably as thin as possible so that light absorption in the diffusion prevention layer can be further reduced. Also in the case where the oxide containing the metal is transparent, the diffusion prevention layer 2 is preferably as thin as possible to the extent that the diffusion prevention layer can reduce diffusion of the anode because even such a transparent oxide absorbs light, albeit only slightly. From the above standpoint, the thickness of the diffusion prevention layer 2 is preferably 10 nm or more, more preferably 20 nm or more, and preferably 50 nm or less, more preferably 40 nm or less.

The material of the diffusion prevention layer 3 is not limited as long as the material contains a nitride containing the metal. Examples of the material include titanium nitride, chromium nitride, vanadium nitride, molybdenum nitride, niobium nitride, tantalum nitride, zirconium nitride, and hafnium nitride. Preferred among them are titanium nitride, chromium nitride, and vanadium nitride because these can further reduce light absorption in the diffusion prevention layer. Many of the materials for the diffusion prevention layer 3 are colored, albeit lightly. The diffusion prevention layer 3 is thus preferably as thin as possible so that light absorption in the diffusion prevention layer can be further reduced. From the above standpoint, the thickness of the diffusion prevention layer 3 is preferably 10 nm or more, more preferably 15 nm or more, and preferably 40 nm or less, more preferably 30 nm or less.

The material of the diffusion prevention layer 4 is a thin film containing graphite as a main component. As long as the graphite contains sp2 bonds as a main component, the graphite can function as the diffusion prevention layer even when the graphite also contains some sp3 bonds or hydrogen atoms. The graphite needs to be dense while functioning as the diffusion prevention layer. Thus, nanocarbon materials such as carbon nanotube, fullerene, and graphene, which are carbon-based materials like graphite, cannot sufficiently function as the diffusion prevention layer. Many of the materials for the diffusion prevention layer 4 are colored, albeit lightly. The diffusion prevention layer 4 is thus preferably as thin as possible so that light absorption in the diffusion prevention layer can be further reduced. From the above standpoint, the thickness of the diffusion prevention layer 4 is preferably 2 nm or more, more preferably 5 nm or more, and preferably 50 nm or less, more preferably 30 nm or less.

The diffusion prevention layer may contain other additives without impairing the effects of the present invention.

The diffusion prevention layer may be formed by any method, and may be formed by, preferably, a dry film formation method (e.g., a vapor deposition method, sputtering, CVD) or by wet coating (e.g., spray coating, spin coating). These methods can form the diffusion prevention layer as a dense film.

The solar cell of the present invention may have a hole transport layer between the photoelectric conversion layer and the diffusion prevention layer.

The hole transport layer may be formed from any material, and may contain an organic material. Examples of the material of the hole transport layer include P-type conductive polymers, P-type low-molecular organic semiconductors, P-type metal oxides, P-type metal sulfides, and surfactants. Specific examples thereof include compounds having a thiophene skeleton, such as poly(3-alkylthiophene). The examples also include conductive polymers having a triphenylamine skeleton, a poly-p-phenylenevinylene skeleton, a polyvinylcarbazole skeleton, a polyaniline skeleton, a polyacetylene skeleton, or the like. The examples further include: compounds having a phthalocyanine skeleton, a naphthalocyanine skeleton, a pentacene skeleton, a porphyrin skeleton such as a benzoporphyrin skeleton, a spirobifluorene skeleton or the like; molybdenum sulfide, tungsten sulfide, copper sulfide, and tin sulfide; fluoro group-containing phosphonic acid and carbonyl group-containing phosphonic acid; and copper compounds such as CuSCN and CuI.

The hole transport layer may partly merge with the photoelectric conversion layer or disposed in the shape of a thin film on the photoelectric conversion layer. The lower limit of the thickness of the hole transport layer in the shape of a thin film is preferably 1 nm and the upper limit thereof is preferably 2,000 nm. When the thickness is 1 nm or more, electrons can be sufficiently blocked. When the thickness is 2,000 nm or less, the layer is less likely to serve as resistance to electron transport, enhancing photoelectric conversion efficiency. The lower limit of the thickness is more preferably 3 nm and the upper limit thereof is more preferably 1,000 nm. The lower limit is still more preferably 5 nm and the upper limit is still more preferably 500 nm.

The solar cell of the present invention may further include a substrate or the like. The substrate is not limited, and examples thereof include transparent glass substrates made of soda-lime glass, alkali-free glass, or the like, ceramic substrates, and transparent plastic substrates.

The solar cell of the present invention may be produced by any method. An exemplary method includes forming, on the substrate, the cathode, the electron transport layer, the photoelectric conversion layer, the hole transport layer, the diffusion prevention layer, and the anode in the stated order.

Advantageous Effects of Invention

The present invention can provide a solar cell having high photoelectric conversion efficiency that is less likely to decrease even under prolonged application of a voltage.

BRIEF DESCRIPTION OF DRAWINGS

FIG. 1 is a schematic view illustrating an exemplary crystal structure of an organic-inorganic perovskite compound.

DESCRIPTION OF EMBODIMENTS

The present invention is more specifically described with reference to, but not limited to, the following examples.

Example 1

A 300-nm-thick ITO film was formed as a cathode on a glass substrate, and ultrasonically washed with pure water, acetone, and methanol in the stated order, each for 10 minutes, and then dried.

On the surface of the ITO film was formed, by sputtering, a thin-film titanium oxide electron transport layer having a thickness of 20 nm. Furthermore, a titanium oxide paste containing titanium oxide (mixture of particles with an average particle size of 10 nm and particles with an average particle size of 30 nm) was applied to the thin-film electron transport layer by a spin coating method, whereby a porous electron transport layer having a thickness of 100 nm was formed.

Subsequently, 550 mg of lead iodide as a metal halide was dissolved in a solvent mixture of 1 mL of N,N-dimethylformamide (DMF) and 80 µL of dimethyl sulfoxide, whereby a solution was prepared. This solution was formed into a film on the porous electron transport layer by a spin coating method, whereby a first film was formed. Furthermore, methylammonium iodide as an amine compound was dissolved in 2-propanol to prepare a 6% by weight solution. This solution was formed into a film on the first film by a spin coating method, followed by heating treatment at 150° C. for five minutes. Thus, a 400-nm-thick photoelectric conversion layer containing a perovskite compound $CH_3NH_3PbI_3$ was formed.

Next, a 2% by weight solution of Spiro-OMETAD (produced by Merck) in chlorobenzene was applied to the photoelectric conversion layer by spin coating, whereby a hole transport layer having a thickness of 100 nm was formed.

Then, on the hole transport layer was formed a 10-nm-thick diffusion prevention layer made of molybdenum by an electron beam vapor deposition method.

On the obtained diffusion prevention layer was formed, by sputtering, a 100-nm-thick aluminum film as an anode. Thus, a solar cell was obtained in which the cathode, the electron transport layer, the photoelectric conversion layer, the hole transport layer, the diffusion prevention layer, and the anode were stacked in the stated order (cathode/electron transport layer/photoelectric conversion layer/hole transport layer/diffusion prevention layer/anode).

The obtained solar cell was cut with a focused ion beam (FIB), and the cut plane was observed using a transmission electron microscope (JEM-2010-FEF produced by JEOL Ltd.). In transmission electron microscopic pictures taken at arbitrary ten sites, the upper and lower layers having the diffusion prevention layer therebetween were not in contact at any part, which confirmed that the diffusion prevention layer was a dense film.

Examples 2 to 48 and Comparative Examples 6 to 22

A solar cell in which a cathode, an electron transport layer, a photoelectric conversion layer, a hole transport layer, a diffusion prevention layer, and an anode were stacked in the stated order (cathode/electron transport layer/photoelectric conversion layer/hole transport layer/diffusion prevention layer/anode) was obtained as in Example 1, except that the anode and the type and thickness of the diffusion prevention layer were changed as shown in Tables 1 to 3.

Comparative Examples 1 to 5

A solar cell in which a cathode, an electron transport layer, a photoelectric conversion layer, a hole transport layer, and an anode were stacked in the stated order (cathode/electron transport layer/photoelectric conversion layer/hole transport layer/anode) was obtained as in Example 1, except that no diffusion prevention layer was formed and an anode shown in Table 3 was formed on the hole transport layer by an electron beam vapor deposition method.

Comparative Example 23

A 300-nm-thick ITO film was formed as a cathode on a glass substrate, and ultrasonically washed with pure water, acetone, and methanol in the stated order, each for 10 minutes, and then dried. Subsequently, on the surface of the ITO film was formed, by sputtering, a thin-film titanium oxide electron transport layer having a thickness of 20 nm. Then, a 1:1 solution of PTB7 (produced by Aldrich) and PCBM (produced by Aldrich) in chlorobenzene was formed into a film on the electron transport layer by a spin coating method, whereby a 100-nm-thick photoelectric conversion layer containing an organic semiconductor was formed. Thereafter, a PEDOT:PSS (produced by Aldrich) film was formed on the photoelectric conversion layer by a spin coating method, whereby a 50-nm-thick hole transport layer was formed. Thereafter, a diffusion prevention layer and an electrode shown in Table 3 were formed by the same procedure as in Example 1. Thus, a solar cell was obtained in which the cathode, the electron transport layer, the photoelectric conversion layer, the hole transport layer, the diffusion prevention layer, and the anode were stacked (cathode/electron transport layer/photoelectric conversion layer/hole transport layer/diffusion prevention layer/anode).

Comparative Examples 24 and 25

A solar cell in which a cathode, an electron transport layer, a photoelectric conversion layer, a hole transport layer, and an anode were stacked in the stated order (cathode/electron transport layer/photoelectric conversion layer/hole transport layer/anode) was obtained as in Comparative Example 23, except that no diffusion prevention layer was formed and an anode shown in Table 3 was formed by an electron beam evaporation method.

<Evaluation>

The solar cells obtained in the examples and comparative examples were evaluated as follows. The results are shown in Table 1.

(1) Evaluation of Photoelectric Conversion Efficiency

A power source (model 236 produced by Keithley Instruments Inc.) was connected between the electrodes of the solar cell immediately after the production of the solar cell. The photoelectric conversion efficiency was measured using a solar simulator (produced by Yamashita Denso Corp.) at an intensity of 100 mW/cm$^2$. The obtained photoelectric conversion efficiency was taken as the initial conversion efficiency. The obtained photoelectric conversion efficiency values were standardized with the photoelectric conversion efficiency of the solar cell obtained in Comparative Example 11 set as a benchmark.

6: Standardized initial conversion efficiency value was 1.8 or more.

5: Standardized initial conversion efficiency value was 1.5 or more and less than 1.8.

4: Standardized initial conversion efficiency value was 1.3 or more and less than 1.5.

3: Standardized initial conversion efficiency value was 1.2 or more and less than 1.3

2: Standardized initial conversion efficiency value was 1.0 or more and less than 1.2.

1: Standardized initial conversion efficiency value was less than 1.0.

(2) Evaluation of Durability (Light Resistance) Under Prolonged Application of Voltage A power source (model 236 produced by Keithley Instruments Inc.) was connected between the electrodes of the solar cell. The photoelectric conversion efficiency was mea sured after application of a voltage at 25° C. for 24 hours using a solar simulator (produced by Yamashita Denso Corp.) at an intensity of 100 mW/cm².

5: The photoelectric conversion efficiency after a lapse of 24 hours was 95% or higher relative to the initial conversion efficiency.

4: The photoelectric conversion efficiency after a lapse of 24 hours was 90% or higher and lower than 95% relative to the initial conversion efficiency.

3: The photoelectric conversion efficiency after a lapse of 24 hours was 80% or higher and lower than 90% relative to the initial conversion efficiency.

2: The photoelectric conversion efficiency after a lapse of 24 hours was 60% or higher and lower than 80% relative to the initial conversion efficiency.

1: The photoelectric conversion efficiency after a lapse of 24 hours was lower than 60% relative to the initial conversion efficiency.

TABLE 1

| | Cathode | Photoelectric conversion layer | Diffusion prevention layer | Thickness of diffusion prevention layer (nm) | Anode | Photoelectric conversion efficiency | Light resistance test |
|---|---|---|---|---|---|---|---|
| Example 1 | ITO | Perovskite | Mo | 10 | Al | 4 | 5 |
| Example 2 | ITO | Perovskite | Mo | 5 | Al | 4 | 4 |
| Example 3 | ITO | Perovskite | Mo | 20 | Al | 4 | 5 |
| Example 4 | ITO | Perovskite | Mo | 30 | Al | 3 | 5 |
| Example 5 | ITO | Perovskite | Mo | 20 | Cu | 4 | 4 |
| Example 6 | ITO | Perovskite | Mo | 20 | Sb | 3 | 5 |
| Example 7 | ITO | Perovskite | W | 10 | Al | 4 | 5 |
| Example 8 | ITO | Perovskite | Ta | 10 | Al | 4 | 5 |
| Example 9 | ITO | Perovskite | Nb | 10 | Al | 3 | 5 |
| Example 10 | ITO | Perovskite | Zr | 10 | Al | 3 | 5 |
| Example 11 | ITO | Perovskite | Hf | 10 | Al | 3 | 5 |
| Example 12 | ITO | Perovskite | Nb doped $TiO_2$ | 50 | Cu | 4 | 5 |
| Example 13 | ITO | Perovskite | ITO | 50 | Cu | 5 | 4 |
| Example 14 | ITO | Perovskite | ITO | 50 | Al | 3 | 4 |
| Example 15 | ITO | Perovskite | ITO | 50 | Sb | 4 | 5 |
| Example 16 | ITO | Perovskite | GZO | 50 | Cu | 4 | 5 |
| Example 17 | ITO | Perovskite | NiO | 50 | Cu | 4 | 4 |
| Example 18 | ITO | Perovskite | MoOx | 20 | Cu | 6 | 4 |
| Example 19 | ITO | Perovskite | WOx | 20 | Cu | 5 | 4 |
| Example 20 | ITO | Perovskite | VOx | 20 | Cu | 6 | 4 |
| Example 21 | ITO | Perovskite | CrOx | 20 | Cu | 5 | 4 |
| Example 22 | ITO | Perovskite | MoOx | 5 | Mo | 6 | 5 |
| Example 23 | ITO | Perovskite | MoOx | 3 | Mo | 5 | 5 |
| Example 24 | ITO | Perovskite | MoOx | 10 | Mo | 6 | 5 |

TABLE 2

| | Cathode | Photoelectric conversion layer | Diffusion prevention layer | Thickness of diffusion prevention layer (nm) | Anode | Photoelectric conversion efficiency | Light resistance test |
|---|---|---|---|---|---|---|---|
| Example 25 | ITO | Perovskite | MoOx | 30 | Mo | 6 | 5 |
| Example 26 | ITO | Perovskite | MoOx | 100 | Mo | 5 | 5 |
| Example 27 | ITO | Perovskite | MoOx | 200 | Mo | 4 | 5 |
| Example 28 | ITO | Perovskite | ATO | 50 | Al | 5 | 5 |
| Example 29 | ITO | Perovskite | PbO | 50 | Al | 4 | 5 |
| Example 30 | ITO | Perovskite | TiN | 50 | Al | 3 | 5 |
| Example 31 | ITO | Perovskite | TiN | 20 | Al | 3 | 5 |
| Example 32 | ITO | Perovskite | TiN | 5 | Al | 3 | 4 |
| Example 33 | ITO | Perovskite | VN | 20 | Al | 3 | 5 |
| Example 34 | ITO | Perovskite | CrNx | 20 | Al | 3 | 5 |
| Example 35 | ITO | Perovskite | CrNx | 20 | Cu | 3 | 4 |
| Example 36 | ITO | Perovskite | CrNx | 20 | Sb | 3 | 5 |
| Example 37 | ITO | Perovskite | NbN | 20 | Al | 3 | 5 |
| Example 38 | ITO | Perovskite | TaN | 20 | Al | 4 | 5 |
| Example 39 | ITO | Perovskite | MoN | 20 | Al | 5 | 5 |
| Example 40 | ITO | Perovskite | ZrN | 20 | Al | 4 | 5 |
| Example 41 | ITO | Perovskite | HfN | 20 | Al | 4 | 5 |
| Example 42 | ITO | Perovskite | Graphite | 5 | Al | 4 | 4 |
| Example 43 | ITO | Perovskite | Graphite | 20 | Al | 5 | 4 |
| Example 44 | ITO | Perovskite | Graphite | 50 | Al | 4 | 4 |
| Example 45 | ITO | Perovskite | Graphite | 20 | Cu | 5 | 4 |
| Example 46 | ITO | Perovskite | Graphite | 20 | Mo | 5 | 5 |
| Example 47 | ITO | Perovskite | Graphite | 5 | Mo | 5 | 5 |
| Example 48 | ITO | Perovskite | Graphite | 50 | Mo | 4 | 5 |

TABLE 3

| | Cathode | Photoelectric conversion layer | Diffusion prevention layer | Thickness of diffusion prevention layer (nm) | Anode | Photoelectric conversion efficiency | Light resistance test |
|---|---|---|---|---|---|---|---|
| Comparative Example 1 | ITO | Perovskite | — | — | ITO | 2 | 5 |
| Comparative Example 2 | ITO | Perovskite | — | — | Au | 6 | 2 |
| Comparative Example 3 | ITO | Perovskite | — | — | Ag | 6 | 1 |
| Comparative Example 4 | ITO | Perovskite | — | — | Cr | 2 | 2 |
| Comparative Example 5 | ITO | Perovskite | — | — | Al | 1 | 1 |
| Comparative Example 6 | ITO | Perovskite | ITO | 50 | Ti | 2 | 5 |
| Comparative Example 7 | ITO | Perovskite | ITO | 50 | Ag | 4 | 2 |
| Comparative Example 8 | ITO | Perovskite | ITO | 50 | Cr | 2 | 5 |
| Comparative Example 9 | ITO | Perovskite | Mo | 3 | Al | 3 | 3 |
| Comparative Example 10 | ITO | Perovskite | TiN | 70 | Al | 2 | 5 |
| Comparative Example 11 | ITO | Perovskite | TiN | 3 | Al | 2 | 3 |
| Comparative Example 12 | ITO | Perovskite | Mo | 40 | Al | 2 | 5 |
| Comparative Example 13 | ITO | Perovskite | AlN | 20 | Al | 1 | 5 |
| Comparative Example 14 | ITO | Perovskite | $Al_2O_3$ | 20 | Al | 1 | 5 |
| Comparative Example 15 | ITO | Perovskite | MgO | 10 | Al | 1 | 5 |
| Comparative Example 16 | ITO | Perovskite | Zn | 10 | Al | 1 | 1 |
| Comparative Example 17 | ITO | Perovskite | Ti | 10 | Al | 2 | 2 |
| Comparative Example 18 | ITO | Perovskite | Graphite | 1 | Al | 3 | 2 |
| Comparative Example 19 | ITO | Perovskite | Graphite | 100 | Mo | 2 | 5 |
| Comparative Example 20 | ITO | Perovskite | Carbon nanotube | 20 | Al | 3 | 2 |
| Comparative Example 21 | ITO | Perovskite | C60 | 20 | Al | 2 | 2 |
| Comparative Example 22 | ITO | Perovskite | Graphene | 20 | Al | 3 | 2 |
| Comparative Example 23 | ITO | Organic semiconductor | Mo | 10 | Al | 2 | 3 |
| Comparative Example 24 | ITO | Organic semiconductor | — | — | ITO | 2 | 4 |
| Comparative Example 25 | ITO | Organic semiconductor | — | — | Au | 2 | 4 |

INDUSTRIAL APPLICABILITY

The present invention can provide a solar cell having high photoelectric conversion efficiency that is less likely to decrease even under prolonged application of a voltage.

The invention claimed is:
1. A solar cell comprising:
a cathode;
a photoelectric conversion layer;
a hole transport layer;
a diffusion prevention layer; and
an anode in the stated order,
the cathode being a transparent electrode,
the anode containing at least one selected from the group consisting of aluminum, copper, antimony, and molybdenum,
the photoelectric conversion layer containing an organic-inorganic perovskite compound represented by the formula AMX wherein A represents an organic base compound and/or an alkali metal, M represents a lead or tin atom, and X represents a halogen atom,
the diffusion prevention layer being:
a diffusion prevention layer that contains tungsten, tantalum, niobium, zirconium, hafnium, or an alloy containing one or more thereof and has a thickness of 5 to 30 nm;
a diffusion prevention layer that contains an oxide containing titanium, gallium, antimony, molybdenum, tungsten, vanadium, chromium, or lead;
a diffusion prevention layer that contains a nitride containing titanium, vanadium, chromium, niobium, tantalum, molybdenum, zirconium, or hafnium and has a thickness of 5 to 50 nm; or
a diffusion prevention layer that contains graphite and has a thickness of 2 nm to 50 nm, wherein, when the diffusion prevention layer contains the oxide, the anode contains molybdenum or consists of antimony.

* * * * *